(12) United States Patent
Kimura

(10) Patent No.: US 8,513,985 B2
(45) Date of Patent: Aug. 20, 2013

(54) DRIVE CIRCUIT FOR SEMICONDUCTOR SWITCHING ELEMENT

(75) Inventor: Tomonori Kimura, Obu (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 13/371,773

(22) Filed: Feb. 13, 2012

(65) Prior Publication Data

US 2012/0206169 A1  Aug. 16, 2012

(30) Foreign Application Priority Data

Feb. 15, 2011  (JP) .................................. 2011-29734

(51) Int. Cl.
  *H03K 3/00*  (2006.01)
(52) U.S. Cl.
  USPC .............. 327/109; 327/309; 326/83
(58) Field of Classification Search
  USPC ................ 327/108–112, 306, 309, 310, 312, 327/314, 323, 325, 427, 434, 430–432; 326/82–83
  See application file for complete search history.

(56) References Cited

U.S. PATENT DOCUMENTS

| | | |
|---|---|---|
| 6,180,959 B1 | 1/2001 | Iwasaki et al. |
| 2004/0075486 A1 | 4/2004 | Takehara |
| 2005/0001659 A1 | 1/2005 | Inoshita |
| 2007/0195556 A1 | 8/2007 | Nakamura et al. |
| 2008/0122497 A1 | 5/2008 | Ishikawa et al. |
| 2010/0295523 A1 | 11/2010 | Grbovic |

FOREIGN PATENT DOCUMENTS

| | | |
|---|---|---|
| JP | A-2002-223157 | 8/2002 |
| JP | A-2004-194450 | 7/2004 |
| JP | B2-3572400 | 7/2004 |
| JP | A-2005-12972 | 1/2005 |
| JP | B2-3731562 | 10/2005 |
| JP | A-2007-174134 | 7/2007 |
| JP | A-2010-35387 | 2/2010 |

OTHER PUBLICATIONS

Office Action mailed Jan. 8, 2013 in corresponding JP Application No. 2011-029734 (and English translation).
U.S. Appl. No. 13/371,858, filed Feb. 13, 2012, Kimura et al.
U.S. Appl. No. 13/371,894, filed Feb. 13, 2012, Kimura.

*Primary Examiner* — Long Nguyen
*Assistant Examiner* — Thomas Skibinski
(74) *Attorney, Agent, or Firm* — Posz Law Group, PLC

(57) ABSTRACT

A drive circuit for a semiconductor switching element is disclosed. The drive circuit includes a power supply, a capacitor, a connection changeover unit for switching a connection form between the power supply and the capacitor, a resistor connected to a control terminal of the semiconductor switching element, first and second switching elements whose common connection point is connected to the resistor, a positive-side diode whose cathode is connected to the first switching element, a negative-side diode whose anode is connected to the second switching element, and a current conduction control circuit for controlling the connection changeover unit, and the first and second switching elements to form (i) a first path for charging the capacitor, (ii) a second path for charging the control terminal of the semiconductor switching element, and (iii) a third path for discharging the control terminal of the semiconductor switching element.

6 Claims, 12 Drawing Sheets

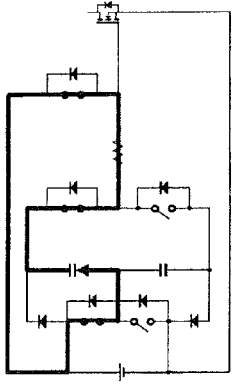
FIG. 3A  INITIAL
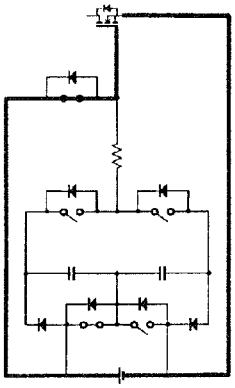
FIG. 3B  TURN OFF Sa2
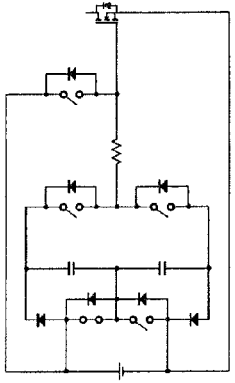
FIG. 3D  TURN OFF S2
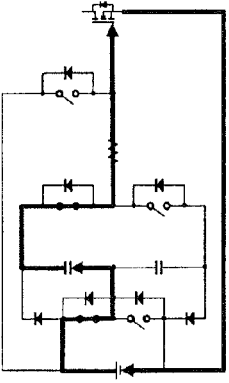
FIG. 3E  TURN ON S1
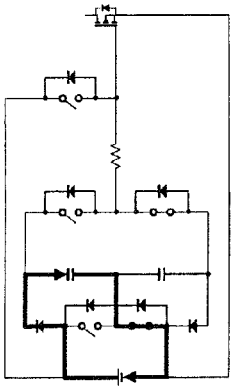
FIG. 3G  TURN ON S3
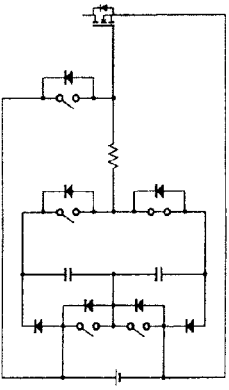
FIG. 3H  TURN OFF S1
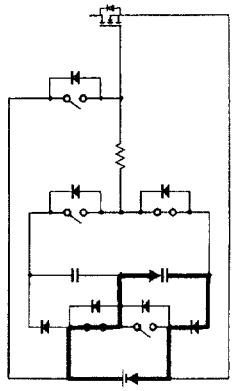
FIG. 3C  TURN ON Sa1
FIG. 3F  Vgs > VG, BACKFLOW

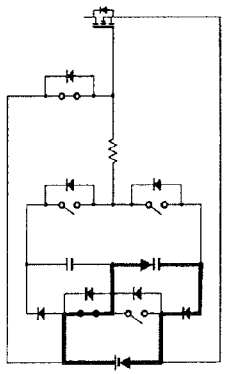
FIG. 4A INITIAL
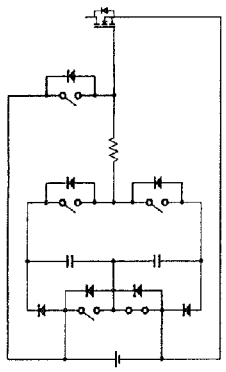
FIG. 4D TURN OFF S3
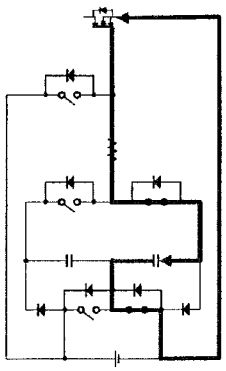
FIG. 4B TURN OFF Sa1
FIG. 4E TURN ON S2
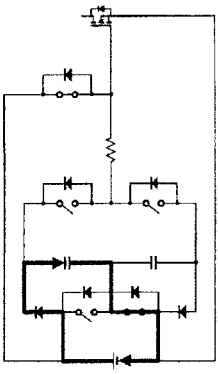
FIG. 4C TURN ON Sa2
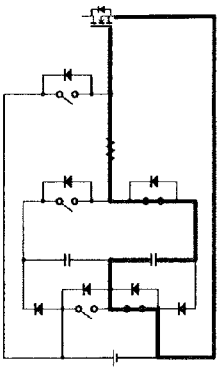
FIG. 4F TURN OFF COMPLETE

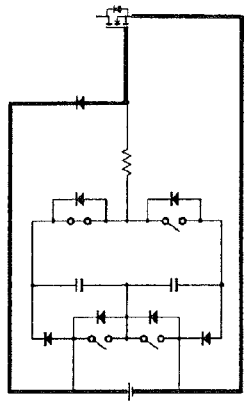
FIG. 7A
INITIAL
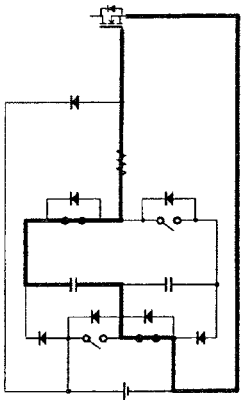
FIG. 7B
TURN OFF Sa2
FIG. 7C
TURN ON Sa1
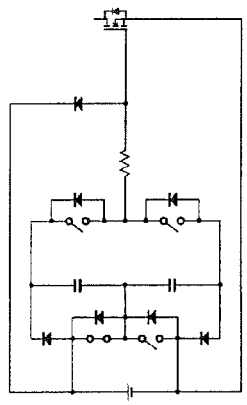
FIG. 7D
TURN OFF S2
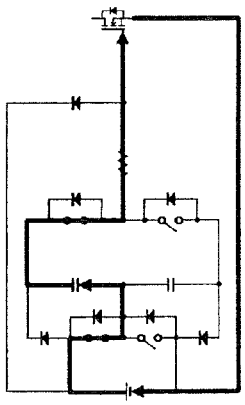
FIG. 7E
TURN ON S1
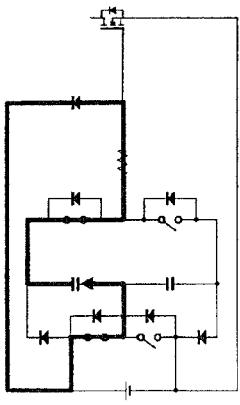
FIG. 7F
Vgs > VG, BACKFLOW
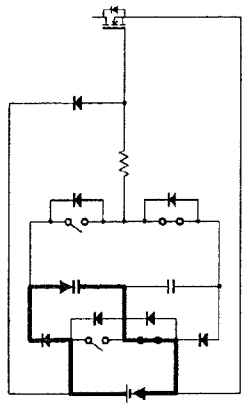
FIG. 7G
TURN OFF Sa1
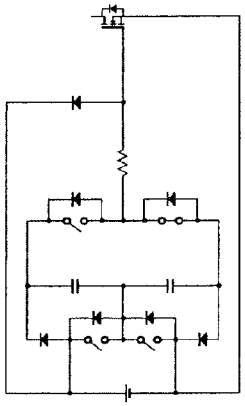
FIG. 7H
TURN ON Sa2
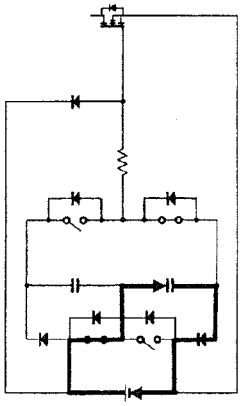

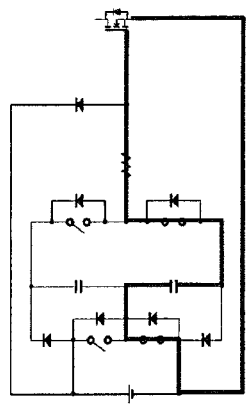
FIG. 8A INITIAL
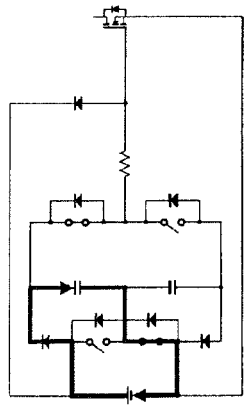
FIG. 8B TURN OFF S1
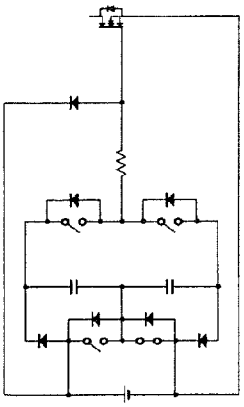
FIG. 8C TURN ON S2
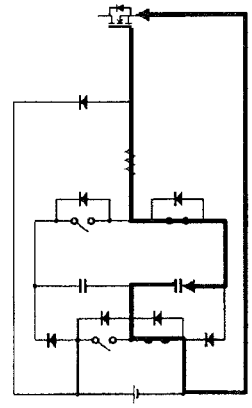
FIG. 8D COMPLETION

INI: OFF

TURN OFF Sa2

TURN ON Sa1, Sa4

TURN OFF S2, Sa1, Sa4

TURN ON Sa3

TURN ON S1

Vgs > VG, BACKFLOW

TURN OFF S1, Sa3

TURN ON S3, Sa1, Sa4

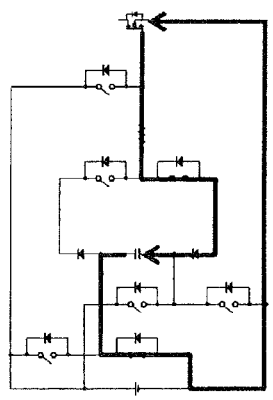
FIG. 12A
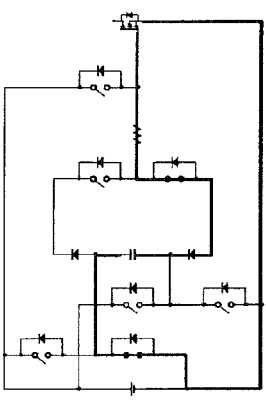
FIG. 12B  INI: ON
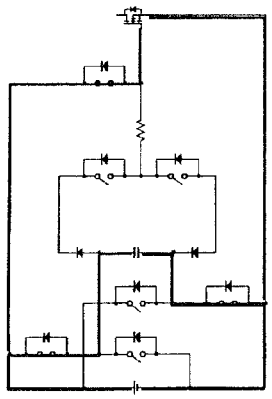
FIG. 12C  TURN OFF S3, Sa1, Sa4
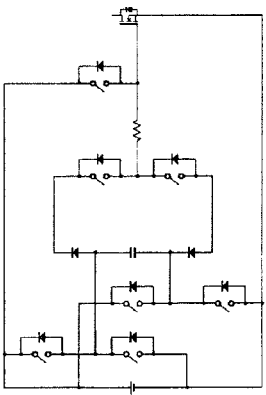
FIG. 12D  TURN ON Sa2
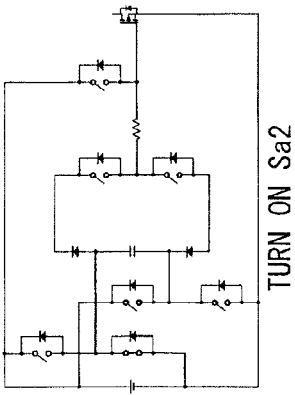
FIG. 12E  TURN ON S2
COMPLETION

DRIVE CIRCUIT FOR SEMICONDUCTOR SWITCHING ELEMENT

CROSS REFERENCE TO RELATED APPLICATION

The present application is based on and claims priority to Japanese Patent Application No. 2011-29734 filed on Feb. 15, 2011, disclosure of which is incorporated herein by reference.

TECHNICAL FIELD

The present disclosure relates to a drive circuit for driving a drive-target switching element in which there is a limitation to a drive voltage applied to its control terminal.

BACKGROUND

For example, in order to ensure safety in operation of a power switching element such as a power MOSFET (metal-oxide semiconductor field-effect transistor) and the like, it is required to drive and control the power switching element so that the power switching element is normally-off. A SiC-JFET (silicon carbide junction field effect transistor) and a GaN-FET (gallium nitride field effect transistor) are next generation devices having a remarkably lower loss than Si-MOSFET, and can achieve normally-off. However, it often happens that voltage of only a few V (e.g., about 2 to 3 V) can be applied to gates of these FETs, while the voltage of 10 to 20 V can be applied to a gate of the Si power MOSFET. The devices such as SiC-JFET and GaN-FET cannot be driven at a high voltage, and as a result, high speed switching is difficult.

Patent document 1 (JP-3655049B2 corresponding to U.S. Pat. No. 6,180,959B2) describes a technique for limiting a gate voltage (see FIG. 11 for example). Specifically, a series circuit of a gate resistor and a Zener diode is connected between an emitter of a gate driving transistor and a ground, and a gate of a static induction transistor is connected to a common connection point of the gate resistor and the Zener diode, whereby Zener voltage clamps the gaze voltage.

According to a configuration of Patent Document 1, however, since a current continues to flow through the Zener diode while the static induction transistor is in ON, a loss in the drive circuit is large. The configuration of Patent Document 1 cannot deal with switching in a high frequency band.

SUMMARY

It is an object of the present disclosure to provide a drive circuit for a semiconductor switching element in which there is a limitation on drive voltage application, the drive circuit capable of switching the semiconductor switching element at a high speed and a high frequency.

According to an example of the present disclosure, a drive circuit for a semiconductor switching element comprises: a driving-usage power supply that supplies a drive voltage, which is applied between a control terminal and a potential reference terminal of a drive-target switching element; at least one capacitor that is charged by the driving-usage power supply; a connection changeover unit that is connected between the driving-usage power supply and the capacitor, and that switches a connection form between the driving-usage power supply and the capacitor; a resistor element that is connected to the control terminal of the drive-target switching element; and a first switching element and a second switching element that are connected in series with each other. The common connection point of the first switching element and the second switching element is connected to the resistor element. A first free wheel diode is connected in parallel with the first switching element so that the first free wheel diode is reverse-connected with respect to polarity of the driving-usage power supply. The second free wheel diode is connected in parallel with the second switching element so that the second free wheel diode is reverse-connected with respect to the polarity of the driving-usage power supply. The drive circuit further comprises a positive-side diode whose cathode is connected to an end of the first switching element; a negative-side diode whose anode is connected to an end of the second switching element; a backflow path formation element that is connected between the control terminal of the drive-target switching element and the driving-usage power supply, and that is brought into a conductive state when electric potential of the control terminal changes so as to exceed voltage of the driving-usage power supply; and a current conduction control circuit that controls the connection changeover unit, the first switching element and the second switching element to form (i) a first current conduction path in which the capacitor is charged, (ii) a second current conduction path in which the driving-usage power supply and the capacitor are connected in series with each other, and the control terminal of the drive-target switching element is charged via the resistor element, and (iii) a third current conduction path in which the control terminal of the drive-target switching element is connected to a negative terminal of the driving-usage power supply via the capacitor, and the control terminal of the drive-target switching element is discharged via the resistor element.

The above drive circuit is capable of switching the semiconductor switching element (drive-target switching element) at a high speed and a high frequency.

BRIEF DESCRIPTION OF THE DRAWINGS

The above and other objects, features and advantages of the present disclosure will become more apparent from the following detailed description made with reference to the accompanying drawings. In the drawings:

FIGS. 3A to 3H are diagrams illustrating electric current paths in a turn on operation in accordance with the first embodiment;

FIGS. 4A to 4F are diagrams illustrating electric current paths in a turn off operation in accordance with the first embodiment;

FIGS. 7A to 7H are diagrams illustrating electric current paths in a turn on operation in accordance with the second embodiment;

FIGS. 8A to 8D are diagrams illustrating electric current paths in a turn off operation in accordance with the second embodiment;

FIGS. 12A to 12E are diagrams illustrating electric current paths in a turn off operation in accordance with the second embodiment.

DETAILED DESCRIPTION

First Embodiment

Figure 1:
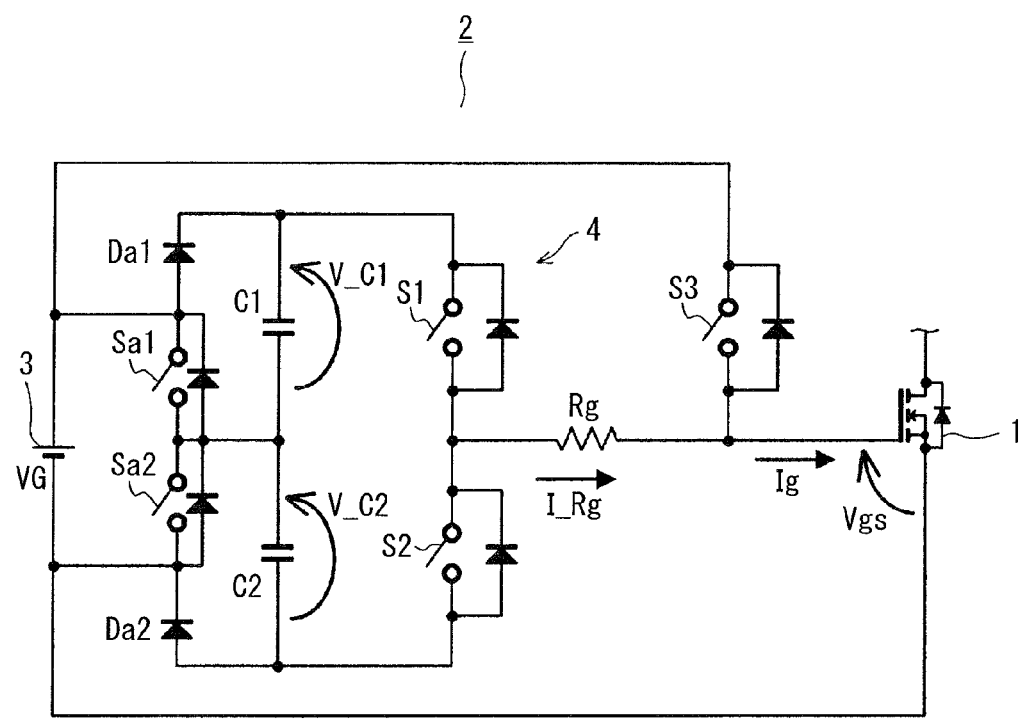
FIG. 1 is a diagram illustrating an electric configuration of a drive circuit of a first embodiment.

A first embodiment will be described with reference to FIGS. 1 to 4. FIG. 1 illustrates a drive circuit 2 for driving an N channel FET 1 for example. The N channel FET 1 can correspond to a drive-target switching element. A drain of the N channel FET 1 is connected to a load (not shown). The drive circuit 2 is connected between a gate and a source of the N channel FET 1, and thus employs a low side drive configuration. It should be noted that although the FET 1 is not limited to having a MOS structure, a symbol of MOSFET is used to refer to the N channel FET 1 in the drawings for illustrative purpose.

The drive circuit 2 is connected between the gate and the source of the N channel FET 1. The gate of the N channel FET 1 can correspond to a control terminal. The source of the N channel FET 1 can correspond to an output terminal on a potential reference side or a potential reference terminal. The drive circuit 2 supplies a charge discharge current Ig to the gate of the N channel FET 1 based on a power supplied from a gate drive power supply 3. The gate driver power supply 3 can correspond to a drive-usage power supply. It should be noted that although an entity of a parallel circuit of a switch symbol and a diode symbol illustrated in FIG. 1 is, for example, an N channel MOSFET, the parallel circuit is shown in the drawings using these symbols for simplification.

A positive terminal of the gate drive power supply 3 is connected to a common connection point of a switch Sa1 and a diode Da1, which are connected in series with each other to form a series circuit. The common connection point is an anode of the diode Da1. The switch Sa1 can correspond to a connection changeover means or unit, and a positive-side switching element. The diode Da1 can correspond to a positive-side diode. A negative terminal of the gate drive power supply 3 is connected to a common connection point of a switch Sa2 and a diode Da2, which are connected in series with each other to form a series circuit. The common connection point is a cathode of the diode Da2. The switch Sa2 can correspond to a connection changeover means or unit, and a negative-side switching element. The diode Da2 can correspond to a negative-side diode. The switch Sa1 and the switch Sa2 are connected in series with each other. A series circuit of a switch S1 and a switch S2 is connected between the cathode of the diode Da1 and the anode of the diode Da2. The switch S1 and the switch S2 can correspond to a first switching element and a second switching element, respectively. A series circuit of a capacitor C1 and a capacitor C2 is also connected between the cathode of the diode Da1 and the anode of the diode Da2. The capacitor C1 and the capacitor C2 can correspond to a positive-side capacitor and a negative-side capacitor, respectively. A common connection point of the capacitors C1 and C2 is connected to a common connection point of the switches Sa1 and Sa2.

A resistor element Rg is connected between the gate of the N channel FET 1 and a common connection point of the switches S1 and S2. A switch S3 is connected between the gate of the N channel FET 1 and the positive terminal of the gate drive power supply 3. The switch S3 can correspond to a backflow path formation element and a third switching element. On/off control of the switches Sa1, Sa2, S1, S2, S3 are performed by a control circuit (not shown). The switch Sa1, Sa2, S1 to S3 and the control circuit are included in a current conduction control circuit 4.

Figure 2:
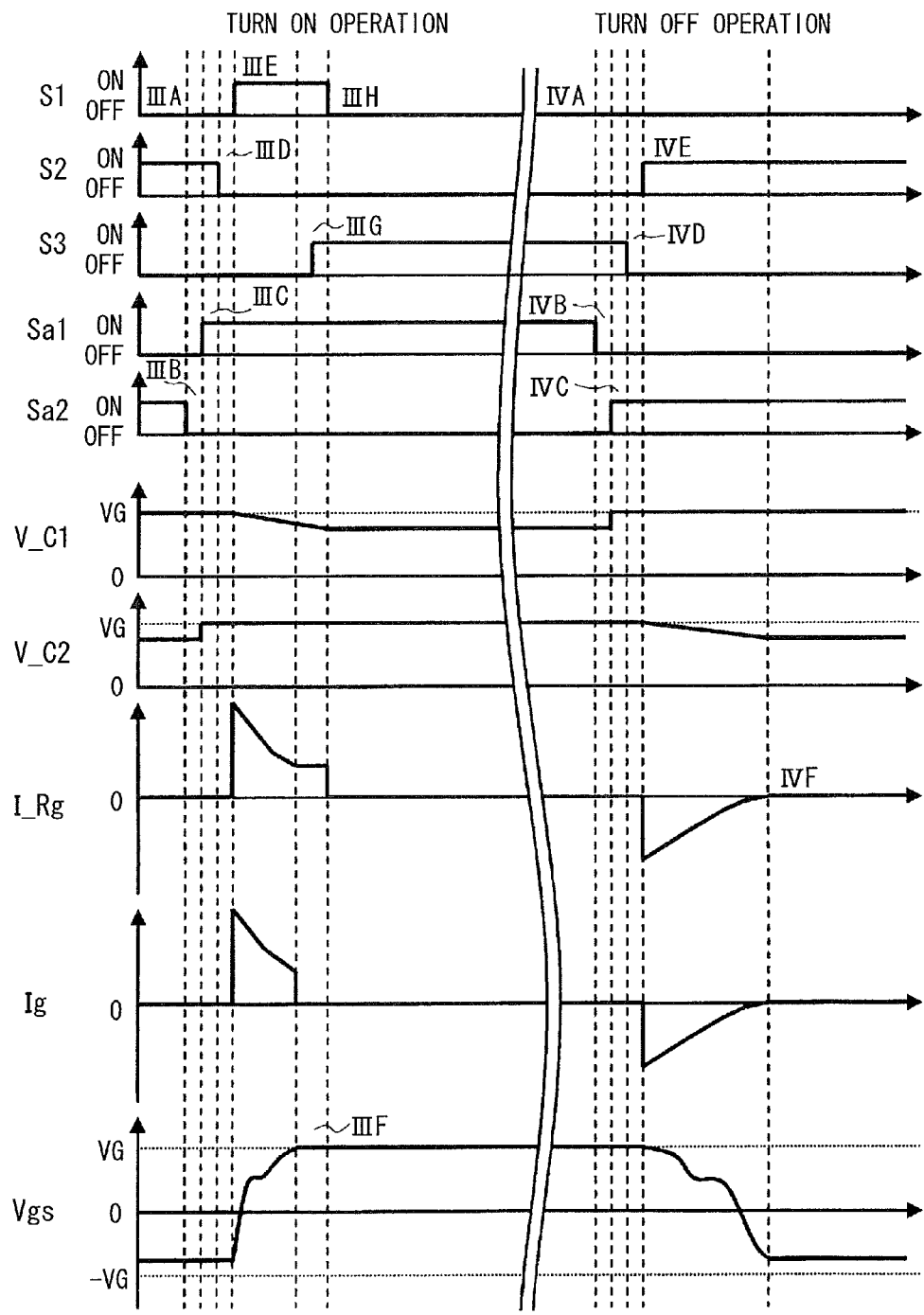
FIG. 2 is a timing chart illustrating signals indicative of operation of the drive circuit of the first embodiment.

Operation of the drive circuit 2 will be described with reference to FIGS. 2 to 4F. FIG. 2 is a timing chart illustrating switching on/off of the switches Sa1, Sa2, S1 to S3 performed by the control circuit, and voltage or current waveforms of respective elements. FIGS. 3A to 3H illustrate an order in which the switches Sa1, Sa2, S1 to S3 are switched when the N channel FET 1 is turned on. FIGS. 3A to 3H further illustrate a current flowing in response to switching the switches Sa1, Sa2, S1 to S3. FIGS. 3A to 3H correspond to symbols IIIA to IIIH in FIG. 2, respectively.

<Turn on of N Channel FET 1>

FIG. 3A illustrates an initial state IIIA in which the switches Sa2 and S2 are in ON, whereby the N channel FET 1 is in a turn-off state and has an gate electric potential −VG+Vf, which is an electric potential (e.g., 0V, ground potential) of the negative terminal of the gate drive power supply 3 minus a charging voltage of the capacitor C2. It should be noted that Vf is a forward voltage of the diode. In this sate, the capacitor C1 is charged to have a voltage VG−Vf. When the switch Sa2 is turned off as shown in FIG. 3B and then the switch Sa1 is turned on as shown in FIG. 3C, the capacitor C2 is charged to have a voltage VG−Vf. In FIG. 3C, switching of capacitor connection is completed.

Thereafter, the switch S2 is turned off as shown in FIG. 3D and the switch S1 is turned on as shown in FIG. 3E. In this case, a current conduction path passing through the positive terminal of the gate drive power supply 3, the switch Sa1, the capacitor C1, the switch S1, the resistor element Rg, the gate of the N channel FET 1, the source of the N channel FET 1 and the negative terminal of the gate drive power supply 3 is formed, as shown in FIG. 3E. Accordingly, the gate of the N channel FET 1 is charged via the resistor element Rg in a state where the capacitor C1 and the gate drive power supply are connected in series with each other. That is, the turn on of the N channel FET 1 is started.

Accordingly, a gate-source voltage Vgs of the N channel FET 1 increases. When the voltage Vgs increases above the voltage VG, a backflow current flows as shown in FIG. 3F. Specifically, the current I_Rg flows through the resistor element Rg, a free wheel diode of the switch S3, the switch Sa1, the capacitor C1 and the switch S1. Because of this, the gate-source voltage Vgs is clamped at the voltage VG. Thereafter, when the switch S3 is turned on as shown in FIG. 3G, the current I_Rg flows in the switch S3 in stead of the free wheel diode of the switch S3. Thereafter, when the switch S1 is turned off as shown in FIG. 3H, the current conduction path is interrupted and the turn on of the N channel FET 1 is completed. In this state, the capacitor C2 is charged.

<Turn Off of N Channel FET 1>

FIG. 4A to 4F illustrate a turn-off sequence of the N channel FET 1. FIGS. 4A to 4F correspond to symbols IVA to IVF in FIG. 2, respectively. FIG. 4A illustrates a state where the N channel FET 1 is in ON and the capacitor C2 is charged. Thereafter, the switch Sa1 is turned off as shown in FIG. 4B and the switch Sa2 is turned on as shown in FIG. 4C. Accordingly, switching of capacitor connection is completed and the capacitor C1 is charged. Thereafter, the switch S3 is turned off as shown in FIG. 4D and the switch S2 is turned on as shown in FIG. 4E. Accordingly, a current conduction path passing through the gate of the N channel FET 1, the resistor element Rg, the switch S2, the capacitor C2, the switch Sa2, the negative terminal of the gate drive power supply 3, and the source of the N channel FET 1. Because of this, the voltage −VG+Vf is applied to the resistor element Rg. The current I_Rg flowing in a direction opposite to the case of the turn on of the N channel FET 1 increases. The current I_Rg flows as a current Ig from the gate of the N channel FET 1, and the gate is discharged. Thereafter, when the current I_Rg (=Ig) reaches zero as shown in FIG. 4F, the turn off of the N channel FET 1 is completed, and the capacitor C1 is brought into a charged state.

According to the present embodiment, the diode Da1 and the switch Sa1 form a positive-side series circuit. The switch Sa2 and the diode Da2 form a negative-side series circuit. The capacitor C1 is connected in parallel with the positive-side series circuit. The capacitor C2 is connected in parallel with the negative-side series circuit. With use of the switches Sa1 and Sa2, a connection form between the gate drive power supply 3 and the capacitors C1, C2 is switched. Furthermore, the resistor element Rg is connected between the gate of the N channel FET 1 and the common connection point of the switch S1 and the switch S2. The switch S3 is provided between the gate of the N channel FET 1 and the positive terminal of the gate drive power supply 3.

The current conduction control circuit 4 controls the switches Sa1, Sa2 and S1 to S3, thereby forming multiple paths. In a first path, the capacitors C1, C2 are charged. In a second path, the gate drive power supply 3 and the capacitor C1 are connected in series with each other and the gate of the N channel FET 1 is charged. In a third path, the backflow current flows toward the gate drive power supply 3 when the gate voltage increases above the voltage VG. In a fourth a path, the capacitor C2 is connected to the negative terminal of the gate drive power supply 3 and the gate of the N channel FET 1 is discharged.

Because of this, in charging the gate of the N channel FET 1, it is possible to apply twice the power supply voltage VG via the resistor element Rg, so that a charging current rapidly flows. At this time, it is possible to clamp the gate potential at the power supply voltage VG. Furthermore, in discharging the gate of the N channel FET 1, it is possible to apply a negative polarity voltage via the resistor element Rg. Thus, it is possible to discharge the gate by applying a potential difference that is approximately twice as large as the potential of the gate being in the charged state. Therefore, while limiting the electric potential applied to the gate of the N channel FET 1, it is possible to turn on and off the N channel FET 1 at high speeds. Moreover, since the current conduction control circuit 4 controls the switch S3 also, it is possible to form the path for the backflow current to flow at an appropriate time and it is possible to clamp the gate electric potential.

Second Embodiment

Figure 5:
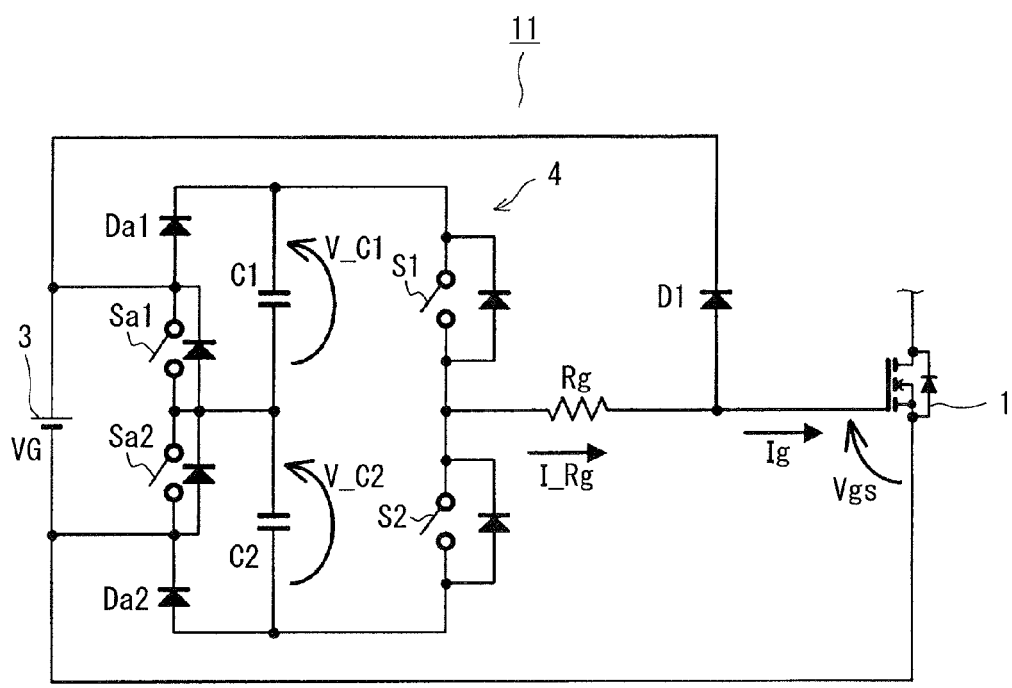
FIG. 5 is a diagram illustrating an electric configuration of a drive circuit of a second embodiment.

FIGS. 5 and 8D illustrate a second embodiment. In the first and second embodiments, like references are used to refer to like parts. In the second embodiment, explanation on like parts may be omitted. The second embodiment differs from the first embodiment in that a drive circuit 11 of the second embodiment includes a diode D1 in place of the switch S3, as shown in FIG. 5. Therefore, the on/off control of the switch S3 is deleted from a timing chart shown in FIG. 6. The on/off control of other switches is slightly different from that in the first embodiment. The diode D1 of the second embodiment can correspond to a backflow path formation element.

Operation of the drive circuit 11 will be described with reference to FIGS. 6 to 8D.

<Turn on of N Channel FET 1>

Figure 6:
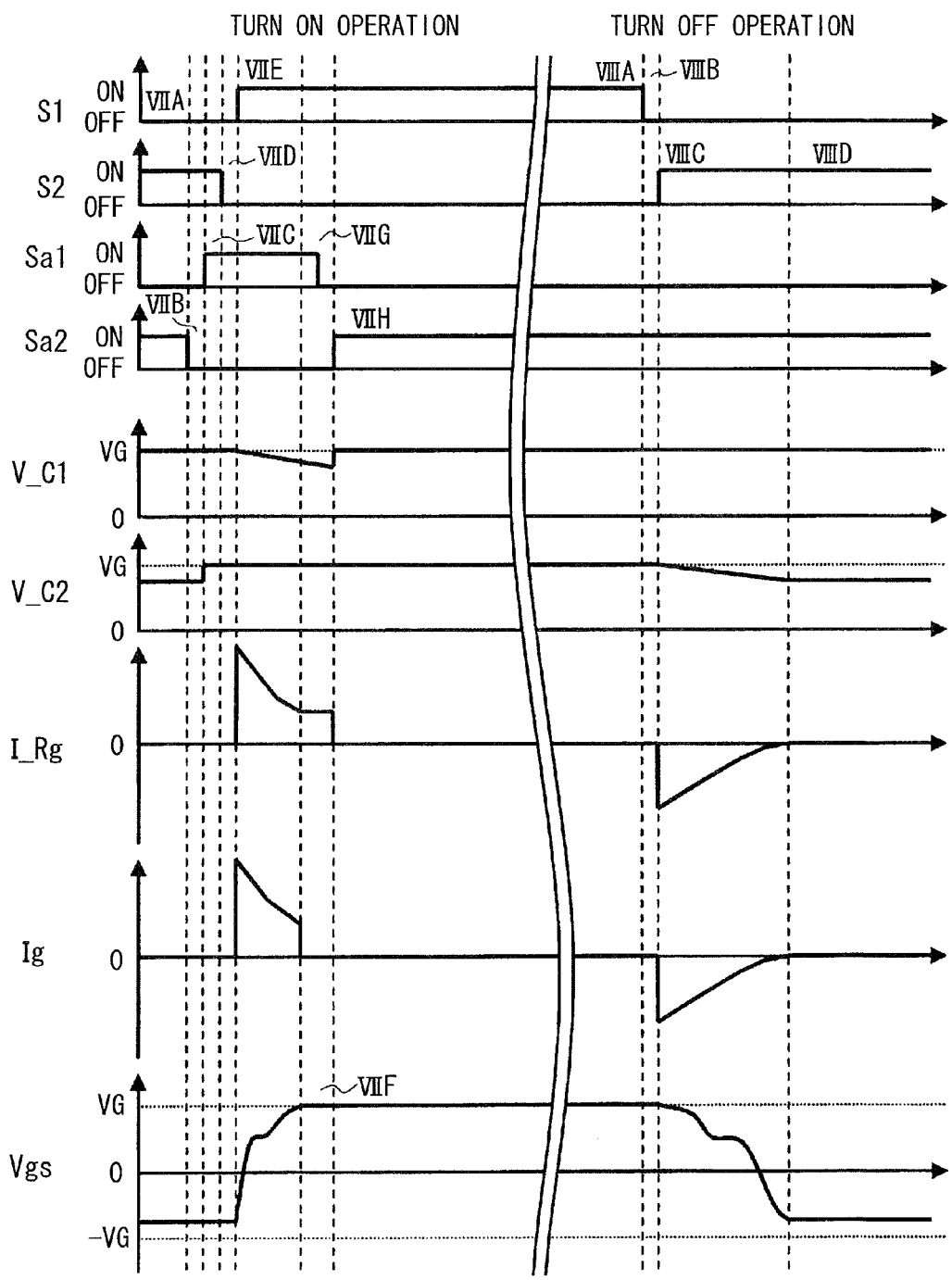
FIG. 6 is a timing chart illustrating signals indicative of operation of the drive circuit of the second embodiment.

FIGS. 7A to 7H illustrate a turn-on sequence of the N channel FET 1, and correspond to VIIA to VIIH in FIG. 6, respectively. The VIIA to VIIF are substantially the same as the IIIA to IIIF in FIG. 2 of the first embodiment. However, in the VIIF, the backflow current flows through the diode D1 instead of the diode connected in parallel with the switch S3, so that the gate-source voltage Vgs is clamped at the voltage VG. In a subsequent event VIIG corresponding to FIG. 7G, the switch Sa1 is turned off. Accordingly, the current I_Rg flows through the gate of the N channel FET 1, the diode D1, the gate drive power supply 3, and the source of the N channel FET 1. Thereafter, when the switch Sa2 is turned on as shown in FIG. 7H, the current conduction path for the current I_Rg to flow is disrupted. Accordingly, the turn on of the N channel FET 1 is completed. Furthermore, in this state, the capacitor C1 is charged.

<Turn Off of N Channel FET 1>

FIGS. 8A to 8D illustrate a turn-off sequence of the N channel FET 1. FIGS. 8A to 8D correspond to the VIII-A to VIII-D in FIG. 6, respectively. Since a current conduction path at the VII-H in the turn-on sequence according to the present embodiment is different from that at the III-H in the turn-on sequence according to the first embodiment, an initial state of the turn-off sequence according to the second embodiment is different from that of the first embodiment. That is, the initial state VIII-A of the turn-off sequence is a state where the capacitor C1 is charged. After the initial state VIII-A, the switch S1 is turned off as shown in FIG. 8B, and then, the switch S2 is turned on as shown in FIG. 8C. Accordingly, a current conduction path that is substantially the same as that shown in FIG. 4E is formed, so that the gate of the N channel FET 1 is discharged. Accordingly, the turn off of the N channel FET 1 is completed as shown in FIG. 8D.

In the second embodiment, the diode D1 is used as the backflow path formation element. Therefore, unlike the first embodiment in which the current conduction control circuit 4 controls the switch S3, the second embodiment automatically forms a path for the backflow current, which flows through the diode D1 in response to a change in gate potential of the N channel FET 1.

Third Embodiment

Figure 9:
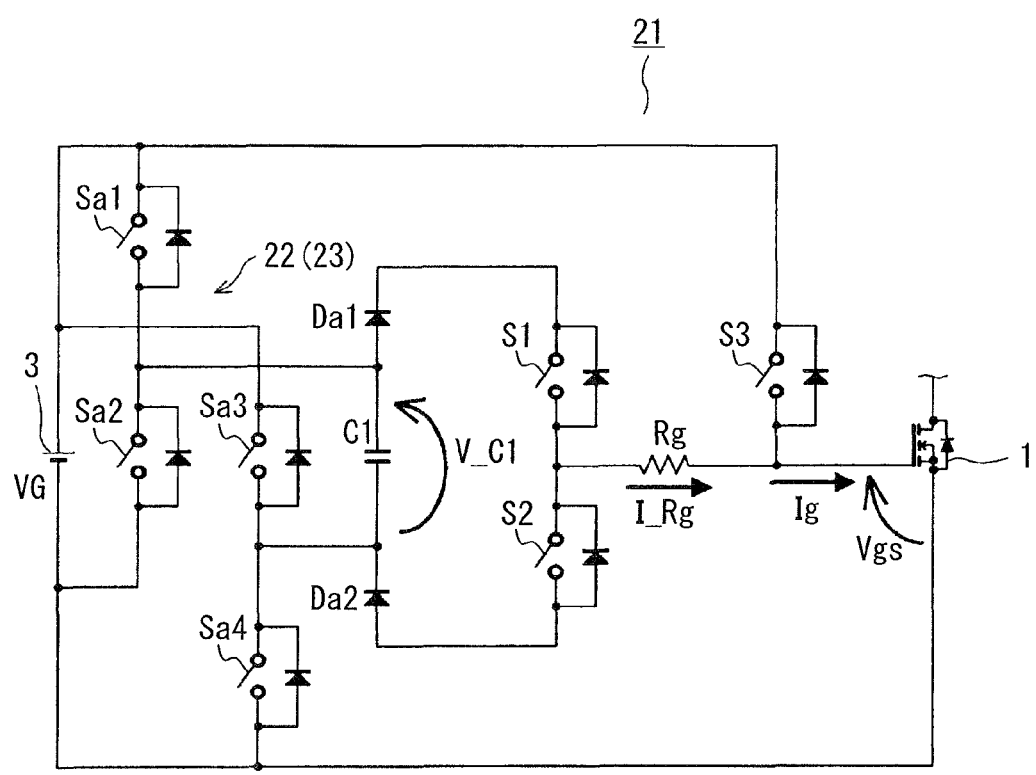
FIG. 9 is a diagram illustrating an electric configuration of a drive circuit of a third embodiment.

FIGS. 9 to 12E illustrate a third embodiment. A difference from the first embodiment will be described. FIG. 9 is a diagram illustrating an electric configuration of a drive circuit 21 of the third embodiment. From the drive circuit 21 of the third embodiment, the capacitor C2 is omitted. In the drier circuit 21, the capacitor C1 is connected between the anode of the diode Da1 and the cathode of the diode Da2. A series circuit of the switch Sa1 and the Sa2 is connected in parallel with a series circuit of the switch Sa3 and the switch Sa4. These switches form a half (H) bridge circuit 22, which can correspond to a connection changeover means or unit. A current conduction control circuit 23 includes the H bridge circuit 22 and a control circuit (not shown). The capacitor C1 is connected between a common connection point of the switches Sa1 and Sa2 and a common connection point of the switches Sa3 and Sa4.

Figure 10:
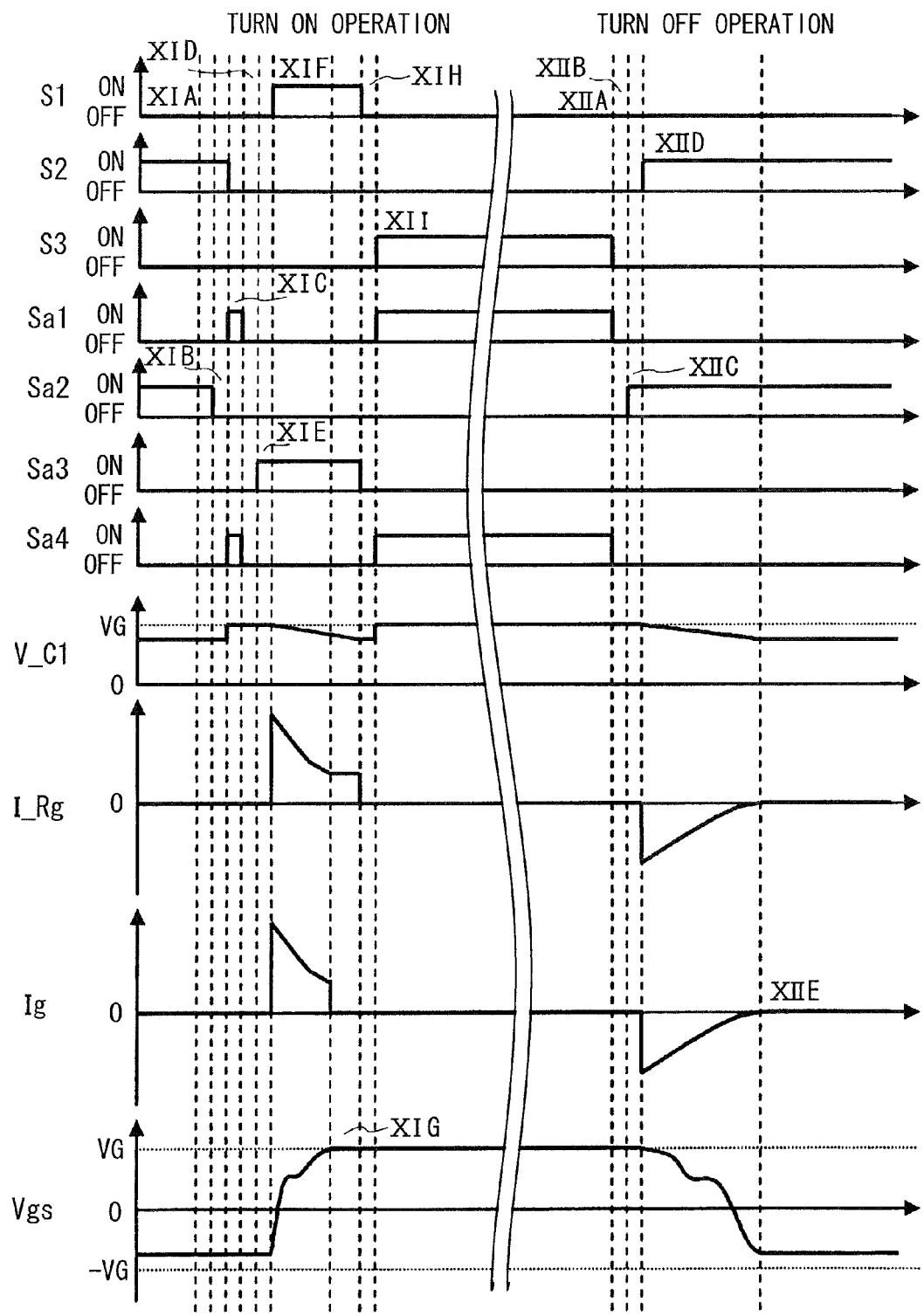
FIG. 10 is a timing chart illustrating signals indicative of operation of the drive circuit of the third embodiment.

Operation of the drive circuit 21 of the third embodiment will be described with reference to FIGS. 10 to 12E. FIG. 10 is a timing chart illustrating signals indicative of operation of the drive circuit 21 of the third embodiment.

Operation of the drive circuit 21 of the third embodiment will be described with reference to FIGS. 10 to 12E.

<Turn on of N Channel FET 1>

Figure 11A:
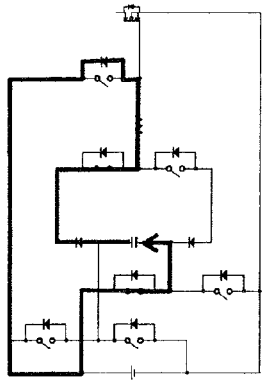
FIGS. 11A to 11I are diagrams illustrating electric current paths in a turn on operation in accordance with the third embodiment.
Figure 11B:
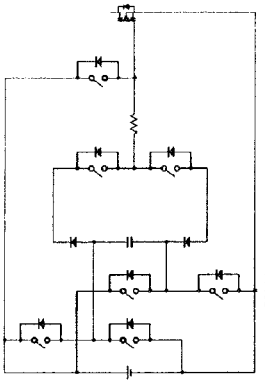
Figure 11C:
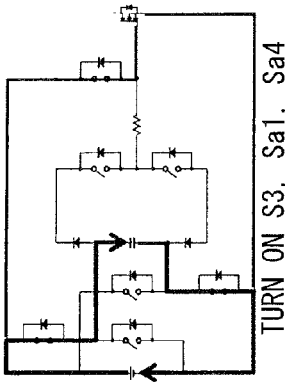

FIG. 11A to 11I illustrate a turn-on sequence of the N channel FET 1 according to the third embodiment. FIGS. 11A to 11I correspond to the XI-A to XI-I in FIG. 10, respectively. In the initial state XI-A corresponding to FIG. 11A, the switches Sa2 and S2 are in ON, and the N channel FET 1 is in a turn off state. Additionally, the N channel FET 1 has an gate electric potential −VG+Vf, which is an electric potential of the negative-side terminal of the gate drive power supply 3 minus a charging voltage of the capacitor C1. Thereafter, the switch Sa2 is turned off as shown in FIG. 11B, and subsequently, the switches Sa1 and S4 are turned on as shown in FIG. 11C. Accordingly, the capacitor C1 is charged to have the voltage VG.

Figure 11D:
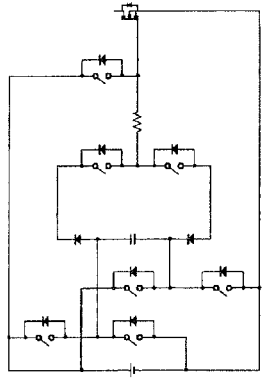
Figure 11E:
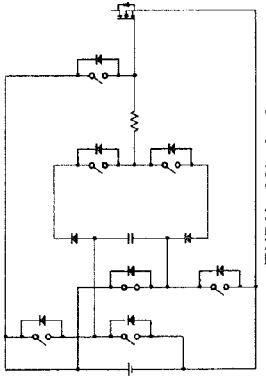
Figure 11F:
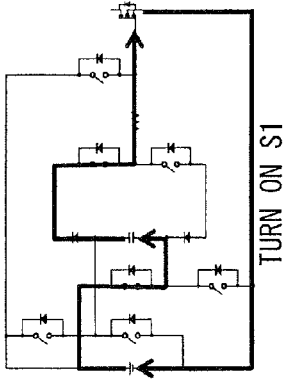

Thereafter, the switches S2, Sa1, Sa4 are turned off as shown in FIG. 11D, and the switch Sa3 is turned on as shown in FIG. 11E, and the switch S1 is turned on as shown in FIG. 11F. Accordingly, a current conduction path passing through the positive terminal of the gate drive power supply 3, the switch Sa3, the capacitor C1, the diode Da1, the switch S1, the resistor element Rg, the gate of the N channel FE1, the source of the N channel FET 1, and the negative terminal of the gate drive power supply 3 is formed. Because of this, the gate of the N channel FET 1 is charged via the resistors element Rg in a state where the capacitor C1 and the gate drive power supply 3 are connected in series with each other.

Figure 11G:
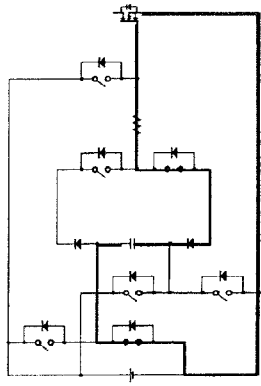
Figure 11H:
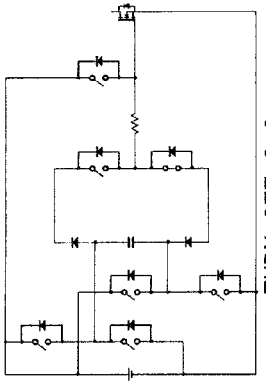
Figure 11I:
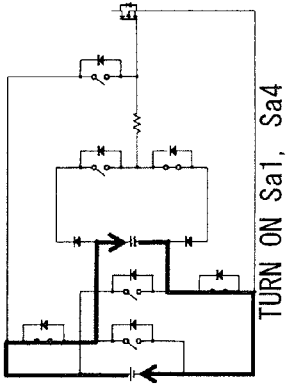

Accordingly, the gate-source voltage Vgs of the N channel FET 1 increases. When the voltage Vgs increases above the voltage VG, the current I_Rg flows through the resistor element Rg, the free wheel diode of the switch S3, the positive terminal of the gate drive power supply 3, the switch S3, the capacitor C1, the diode Da1, and the switch S1, as shown in FIG. 11G corresponding to XI-G in FIG. 10. Because of this, the gate-source voltage Vgs is clamped at voltage VG. Thereafter, the switches S1 and Sa3 are turned off as shown in FIG. 11H, and the switches S3, Sa1, Sa4 are turned on as shown in FIG. 11I. Accordingly, the current I_Rg flows in the switch S3 itself, in stead of the free wheel diode of the switch S3, and the current conduction path is interrupted. As a result, the turn on of the N channel FET 1 is completed. In this state, the capacitor C1 is charged.

<Turn Off of N Channel FET 1>

FIGS. 12A to 12E illustrate a turn-off sequence of the N channel FET 1. FIGS. 12A to 12E correspond to XII-A to XII-E in FIG. 10, respectively. FIG. 12A illustrates a state where the N channel FET 1 is in the turn on state and the capacitor C1 is charged. Thereafter, the switches S3, Sa1 and Sa4 are turned off as shown in FIG. 12B, and the switch Sa2 is turned on as shown in FIG. 12C, and the switch S2 is turned on as shown in FIG. 12D. Accordingly, a current conduction path passing through the gate of the N channel FET 1, the resistor element Rg, the switch S2, the diode Da2, the capacitor C1, the switch Sa2, the negative terminal of the gate drive power supply 3, and the source of the N channel FET 1 is formed. Because of this, the voltage −VG+Vf is applied to the resistor element Rg. The current I_Rg flowing in a direction opposite to the case of the turn on of the N channel FET 1 increases. The current I_Rg flows as a current Ig from the gate of the N channel FET 1, thereby discharging the gate. Thereafter, when the current I_Rg (=Ig) reaches zero as shown in FIG. 12E corresponding to XII-E, the turn off of the N channel FET 1 is completed, and the capacitor C1 is brought into a charged state.

According to the third embodiment, the connection changeover means or unit is configured using the H bridge circuit 22 connected to both ends of the gate drive power supply 3. The capacitor C1 is connected between output terminals of the H bridge circuit 22. The anode of the positive-side diode Da1 is connected to one end of the capacitor C1. The cathode of the negative-side diode Da2 is connected to the other end of the capacitor C1. The first and second switching elements S1, S2 are connected between the cathode of the positive-side diode Da1 and the anode of the negative-side diode Da2. Therefore, with use of only the single capacitor C1, it is possible to turn on and off the N channel FET 1 at high speeds.

The above embodiments are merely examples and can be modified or extended in various ways. For example, the third embodiment may use a diode as the backflow path formation element like the second embodiment does. The drive-target switching element may be a MOSFET, a MISFET (metal-Insulator semiconductor field effect transistor, a HEMT (high electron mobility transistor) or the like. A diode connected in parallel with each switching element Sa1 to Sa4 may be omitted.

The present disclosure has various aspects. According to an aspect of the present disclosure, a drive circuit for a semiconductor switching element comprises: a driving-usage power supply that supplies a drive voltage, which is applied between a control terminal and a potential reference terminal of a drive-target switching element; at least one capacitor that is charged by the driving-usage power supply; a connection changeover unit that is connected between the driving-usage power supply and the capacitor, and that switches a connection form between the driving-usage power supply and the capacitor; a resistor element that is connected to the control terminal of the drive-target switching element; and a first switching element and a second switching element that are connected in series with each other. The common connection point of the first switching element and the second switching element is connected to the resistor element. A first free wheel diode is connected in parallel with the first switching element so that the first free wheel diode is reverse-connected with respect to polarity of the driving-usage power supply. The second free wheel diode is connected in parallel with the second switching element so that the second free wheel diode is reverse-connected with respect to the polarity of the driving-usage power supply. The drive circuit further comprises a positive-side diode whose cathode is connected to an end of the first switching element; a negative-side diode whose anode is connected to an end of the second switching element; a backflow path formation element that is connected between the control terminal of the drive-target switching element and the driving-usage power supply, and that is brought into a conductive state when electric potential of the control terminal changes so as to exceed voltage of the driving-usage power supply; and a current conduction control circuit that controls the connection changeover unit, the first switching element and the second switching element to form (i) a first current conduction path in which the capacitor is charged, (ii) a second current conduction path in which the driving-usage power supply and the capacitor are connected in series with each other, and the control terminal of the drive-target switching element is charged via the resistor element, and (iii) a third current conduction path in which the control terminal of the drive-target switching element is connected to a negative terminal of the driving-usage power supply via the capacitor, and the control terminal of the drive-target switching element is discharged via the resistor element.

According to the above drive circuit, in charging the control terminal of the drive-target switching element, it is possible to apply twice the voltage of the driver-usage power supply via the resistor element, so that a charging current rapidly flows. At this time, when the electric potential of the control terminal changes so as exceed the voltage of the driver-usage power supply, it is possible to form a path for a backflow current to flow toward the drive-usage power supply via the backflow path formation element. As a result, it is possible to clamp the electric potential of the control terminal. Furthermore, in discharging the control terminal of the drive-target switching element, it is possible to apply a negative polarity voltage of the drive-usage power supply via the resistor element. Thus, it is possible to discharge the control terminal by applying a potential difference that is approximately twice as large as the potential of the control terminal that is in a charged state. Therefore, while the electric potential applied to the control terminal of the drive-target switching element is being limited, the drive-target switching element can be turned on and off at a high speed.

The above drive circuit may be configured in the following way. The at least one capacitor includes a positive-side capacitor and a negative-side capacitor. The connection changeover unit includes a positive-side switching element and a negative-side switching element. The positive-side diode and the positive-side switching element are connected in series with each other, thereby forming a positive-side series circuit. A common connection point of the positive-side diode and the positive-side switching element is an anode of the positive-side diode and is connected to a positive terminal of the drive-usage power supply. The negative-side diode and the negative-side switching element are connected in series with each other and form a negative-side series circuit. A common connection point of the negative-side diode and the negative-side switching element is a cathode of the negative-side diode and is connected to the negative terminal of the drive-usage power supply. The positive-side capacitor is connected in parallel with the positive-side series circuit. The negative-side capacitor is connected in parallel with the negative-side series circuit. The current conduction control circuit forms the second current conduction path by connecting the drive-usage power supply and the positive-side capacitor in series with each other. The current conduction control circuit forms the third current conduction path by connecting the control terminal of the drive-target switching element to the negative terminal of the drive-usage power supply via the negative-side capacitor. According to this configuration, with use of the two capacitor (i.e., the positive-side and negative-side capacitors), it is possible to easily switch between charging the control terminal of the drive-target switching element and discharging the control terminal of the drive-target switching element.

The above drive circuit may be configured in the following way. The positive-side capacitor and the negative-side capacitor are connected in series with other. A series circuit of the positive-side capacitor and the negative-side capacitor is connected in parallel with a series circuit of the positive-side switching element and the negative-side switching element. According to this configuration, the current conduction control circuit can form the first, second and third current conduction paths by controlling the switching elements in the following ways.

(First current conduction path) Only the negative-side switching element is turned on. As a result, the positive-side capacitor is charged to have a voltage VG–Vf, where VG is the voltage of the drive-usage power supply, and Vf is a forward voltage of the diode. In this case, a current path is from the positive terminal of the drive-usage power supply, the positive-side diode, the positive-side capacitor, the negative-side switching element to the negative terminal of the drive-usage power supply. When the negative-side switching element is turned off and the positive-side switching element is turned on, the negative-side capacitor is changed to have the voltage VG–Vf. In this case, a current path is from the positive terminal of the drive-usage power supply, the positive-side switching element, the negative-side capacitor, the negative-side diode to the negative terminal of the drive-usage power supply.

(Second current conduction path) When the first switching element is turned on, the current flows in a path from the positive terminal of the drive-usage power supply, the positive-side switching element, the positive-side capacitor, the first switching element, the resistor element, the control terminal of the drive-usage switching element, the potential reference terminal of the drive-target switching element to the negative terminal of the drive-usage power supply. As a result, the control terminal of the drive-target switching element is charged.

(Third current conduction path) From a state where the control terminal of the drive-target switching element is charged, the positive-side switching element is turned off and then the second switching element is turned on. Accordingly, a current flows in a path from the control terminal of the drive-target switching element, the resistor element, the second switching element, the negative-side capacitor, the negative-side switching element, the negative terminal of the drive-usage power supply to the potential reference terminal of the drive-target switching element. As a result, the control terminal of the drive-target switching element is discharged.

Alternatively, the drive circuit may be configured in the following way. The connection changeover unit is connected to both ends of the drive-usage power supply, and includes a half bridge circuit having four switching elements. The capacitor is connected between output terminals of the half bridge circuit. An anode of the positive-side diode is connected to one end of the capacitor. A cathode of the negative-side diode is connected to the other end of the capacitor. The first switching element and the second switching element are connected between the cathode of the positive-side diode and the anode of the negative-side diode. According to this configuration, the current conduction control circuit can form the first, second and third current conduction paths by controlling the switching elements in the following ways. In the following, the four switching elements of the half bridge circuit are referred to as H1 to H4, respectively.

(First current conduction path) When both of the switching elements H1 and H4, which are respectively connected at both ends of the drive-usage power supply, are turned on, the capacitor is charged to have a voltage VG.

(Second current conduction path) Both of the switching elements H1 and H4 are turned off, and the switching element H3 and the first switching element are turned on. Accordingly, a current flows in a path from the positive terminal of the drive-usage power supply, the switching element H3, the capacitor, the positive-side capacitor, the first switching element, the resistor element, the control terminal of the drive-usage switching element, the potential reference terminal of the drive-target switching element to the negative terminal of the drive-usage power supply. As a result, the control terminal of the drive-target switching element is charged.

(Third current conduction path) From a state where the control terminal of the drive-target switching element is charged, the switching element H3 and the first switching element are turned off, and then both of the switching elements H1, H4 are turned on to charge the capacitor again. Thereafter, the switching elements H1, H4 are turned off, and the switching element H2 and the second switching element are turned on. Accordingly, a current flows in a path from the control terminal of the drive-target switching element, the resistor element, the second switching element, the capacitor, the switching element H2 to the negative terminal of the drive-usage power supply t. As a result, the control terminal of the drive-target switching element is discharged.

The above drive circuit may be configured such that: the backflow path formation element is a third switching element; and the current conduction control circuit further controls the third switching element to form a path for an backflow current to flow toward the drive-usage power supply through the backflow path formation element when the electric potential of the control terminal changes so as to exceed the voltage of the driving-usage power supply. According to this configuration, it is possible to clamp the electric potential of the control terminal by forming a backflow current path at an appropriate time.

Alternatively, the backflow path formation element may be a diode. Specifically, the diode may be connected between the control terminal of the drive-target switching element and the positive terminal of the drive-usage power supply. In this case, when the electric potential of the control terminal increases above a certain voltage, the diode conducts the current, so that the path for the backflow current to flow is formed. The certain value may be the voltage VG of the drive-usage power supply plus the forward voltage Vf.

While the present disclosure has been described with reference to embodiments thereof, it is to be understood that the disclosure is not limited to the above embodiments and constructions. The present disclosure is intended to cover various modification and equivalent arrangements. In addition, while the various combinations and configurations, which are preferred, other combinations and configurations, including more, less or only a single element, are also within the spirit and scope of the present disclosure.

What is claimed is:

1. A drive circuit for a semiconductor switching element serving as a drive-target switching element, comprising:
    a driving-usage power supply that supplies a drive voltage, which is applied between a control terminal and a potential reference terminal of the drive-target switching element;
    at least one capacitor that is charged by the driving-usage power supply;
    a connection changeover unit that is connected between the driving-usage power supply and the capacitor, and that switches a connection form between the driving-usage power supply and the capacitor;
    a resistor element that is connected to the control terminal of the drive-target switching element;
    a first switching element and a second switching element that are connected in series with each other,
        wherein a common connection point of the first switching element and the second switching element is connected to the resistor element,
        wherein a first free wheel diode is connected in parallel with the first switching element so that the first free wheel diode is reverse-connected with respect to polarity of the driving-usage power supply,
        wherein a second free wheel diode is connected in parallel with the second switching element so that the second free wheel diode is reverse-connected with respect to the polarity of the driving-usage power supply;
    a positive-side diode whose cathode is connected to an end of the first switching element;
    a negative-side diode whose anode is connected to an end of the second switching element;
    a backflow path formation element that is connected between the control terminal of the drive-target switching element and the driving-usage power supply, and that is brought into a conductive state when electric potential of the control terminal changes so as to exceed voltage of the driving-usage power supply; and
    a current conduction control circuit that controls the connection changeover unit, the first switching element and the second switching element to form
        (i) a first current conduction path in which the capacitor is charged,
        (ii) a second current conduction path in which the driving-usage power supply and the capacitor are connected in series with each other, and the control terminal of the drive-target switching element is charged via the resistor element, and
        (iii) a third current conduction path in which the control terminal of the drive-target switching element is connected to a negative terminal of the driving-usage power supply via the capacitor, and the control terminal of the drive-target switching element is discharged via the resistor element.

2. The drive circuit according to claim 1, wherein:
    the at least one capacitor includes a positive-side capacitor and a negative-side capacitor;
    the connection changeover unit includes a positive-side switching element and a negative-side switching element;
    the positive-side diode and the positive-side switching element are connected in series with each other, thereby forming a positive-side series circuit;
    a common connection point of the positive-side diode and the positive-side switching element is an anode of the positive-side diode and is connected to a positive terminal of the drive-usage power supply;
    the negative-side diode and the negative-side switching element are connected in series with each other and form a negative-side series circuit;
    a common connection point of the negative-side diode and the negative-side switching element is a cathode of the negative-side diode and is connected to the negative terminal of the drive-usage power supply;
    the positive-side capacitor is connected in parallel with the positive-side series circuit;
    the negative-side capacitor is connected in parallel with the negative-side series circuit;
    the current conduction control circuit forms the second current conduction path by connecting the drive-usage power supply and the positive-side capacitor in series with each other; and
    the current conduction control circuit forms the third current conduction path by connecting the control terminal of the drive-target switching element to the negative terminal of the drive-usage power supply via the negative-side capacitor.

3. The drive circuit according to claim 2, wherein:
    the positive-side capacitor and the negative-side capacitor are connected in series with other; and
    a series circuit of the positive-side capacitor and the negative-side capacitor is connected in parallel with a series circuit of the positive-side switching element and the negative-side switching element.

4. The drive circuit according to claim 1, wherein:
    the connection changeover unit is connected to both ends of the drive-usage power supply, and includes a half bridge circuit having four switching elements;

the capacitor is connected between output terminals of the half bridge circuit;

an anode of the positive-side diode is connected to one end of the capacitor;

a cathode of the negative-side diode is connected to the other end of the capacitor; and the first switching element and the second switching element are connected between the cathode of the positive-side diode and the anode of the negative-side diode.

5. The drive circuit according to claim 1, wherein:

the backflow path formation element is a third switching element; and the current conduction control circuit further controls the third switching element to form a path for an backflow current to flow toward the drive-usage power supply through the backflow path formation element when the electric potential of the control terminal changes so as to exceed the voltage of the driving-usage power supply.

6. The drive circuit according to claim 1, wherein:
the backflow path formation element is a diode.

* * * * *